United States Patent
Calaman et al.

(10) Patent No.: US 6,397,932 B1
(45) Date of Patent: Jun. 4, 2002

(54) LIQUID-COOLED HEAT SINK WITH THERMAL JACKET

(76) Inventors: Douglas P. Calaman, 271 Elizabeth St., Landisville, PA (US) 17538; Mathew J. Connors, 45 N. Market St., Apt. 12, Lancaster, PA (US) 17603

( * ) Notice: Subject to any disclaimer, the term of this patent is extended or adjusted under 35 U.S.C. 154(b) by 0 days.

(21) Appl. No.: 09/972,458

(22) Filed: Oct. 5, 2001

Related U.S. Application Data

(62) Division of application No. 09/734,092, filed on Dec. 11, 2000.

(51) Int. Cl.[7] .............................. F28F 7/00; F28F 3/14; F28F 19/00
(52) U.S. Cl. ..................... 165/80.4; 165/170; 165/134.1
(58) Field of Search ................ 165/80.4, 170, 165/134.1, 907; 361/699; 257/714, 722

(56) References Cited

U.S. PATENT DOCUMENTS

| | | | | |
|---|---|---|---|---|
| 4,023,616 A | | 5/1977 | Scherbaum ................. 165/80 |
| 4,387,703 A | * | 6/1983 | Poole ......................... 126/632 |
| 4,830,678 A | | 5/1989 | Todorof et al. ............. 136/259 |
| 4,898,234 A | * | 2/1990 | McGovern et al. ......... 165/170 |
| 4,970,579 A | | 11/1990 | Arldt et al. .................. 357/81 |
| 5,070,936 A | | 12/1991 | Carroll et al. ............. 165/80.4 |
| 5,159,529 A | | 10/1992 | Lovgren et al. ............ 361/385 |
| 5,241,131 A | | 8/1993 | Bakhru et al. ............. 174/15.1 |
| 5,329,996 A | * | 7/1994 | Rosenfeld ................... 165/170 |
| 5,473,508 A | * | 12/1995 | Porter et al. ................ 361/695 |
| 5,666,269 A | | 9/1997 | Romero et al. ............. 361/699 |
| 5,829,516 A | | 11/1998 | Lavochkin .................. 165/80.4 |
| 5,841,634 A | | 11/1998 | Visser ......................... 361/699 |
| 5,863,185 A | | 1/1999 | Cochimin et al. .......... 417/44.2 |
| 5,915,463 A | | 6/1999 | Romero et al. ............. 165/80.3 |
| 6,000,912 A | | 12/1999 | Takada et al. ................ 417/32 |
| 6,102,994 A | * | 8/2000 | Zhou et al. .................. 165/133 |
| 6,108,164 A | | 8/2000 | Weber, Jr. ................. 360/97.02 |
| 6,131,649 A | | 10/2000 | Pearl et al. .................. 165/167 |

FOREIGN PATENT DOCUMENTS

JP  405164494 A  * 6/1993

* cited by examiner

Primary Examiner—Henry Bennett
Assistant Examiner—Tho Van Duong
(74) Attorney, Agent, or Firm—Duane Morris LLP

(57) ABSTRACT

A liquid-cooled heat sink is provided having a cooling housing including a peripheral side wall extending from the perimeter of a bottom wall and a lid sized to engage the peripheral side wall so as to form a chamber. A fluid inlet port and a fluid outlet port are defined through the lid, and disposed in fluid communication with the chamber. In one embodiment, a plurality of pins project outwardly from the bottom wall so as to be positioned within the chamber and arranged in a staggered pattern. The pins include an end that engages the undersurface of the lid. In an alternative embodiment, a corrugated fin having a plurality of corrugations is positioned within the chamber so that at least one of the corrugations engages the bottom wall and at least one of the corrugations engages the under surface of the lid.

14 Claims, 11 Drawing Sheets

LIQUID-COOLED HEAT SINK WITH THERMAL JACKET

This application is a divisional application of copending U.S. application Ser. No. 09/734,092, filed Dec. 11, 2000.

FIELD OF THE INVENTION

The present invention generally relates to liquid-cooled heat sinks, and more particularly to a liquid-cooled heat sink for electronic devices that includes obstructions for optimizing heat transfer to the stream of liquid and which includes a thermal jacket to prevent surface moisture condensation from forming during subambient operation.

BACKGROUND OF THE INVENTION

The performance of electronic circuits and their semiconductor devices is limited by temperature. Semiconductor device performance degrades when the internal temperature reaches or exceeds a particular limit. That limit depends upon the nature of the semiconductor device. In order to maintain or increase the performance of such devices, they must be cooled in some way. The manner of cooling depends upon many parameters, including the space available for the cooling process, the temperatures to be encountered, power, etc. In some instances simply passing a fluid over the device or, over a finned heat sink that is attached to the device, is sufficient to maintain the semiconductor at safe operating temperatures.

In one known semiconductor device cooling technique, convecting fins are attached to a semiconductor package, or the package is affixed to a larger metal member, referred to as a heat sink or cold plate. This heat sink draws heat away from the semiconductor device and can be air cooled or liquid cooled, depending upon the particular application. If the heat sink is air cooled it will typically have heat convecting fins.

Different cooling fluids may be used, when liquid cooled methods are employed, depending upon the application and the density of the electronic devices in a given circuit. Boiling liquids are often used, such as fluorinated hydrocarbon refrigerants, which are delivered to the cold plate in liquid form and are boiled to remove heat. These systems often have the highest heat removal rate for a limited "cold plate" area, but require a considerable amount of power to operate, i.e. to be pumped to and from the heat transfer site. In other systems, a cold liquid is circulated through the cold plate with the cold liquid being refrigerator cooled, evaporatively cooled, or convectively cooled.

A problem exists in the foregoing prior art systems in that a portion of the liquid used to cool the semiconductor device tends to stagnate in a region close to the surface of the heat sink. This stagnation typically refers to a reduction in coolant speed near the heat sink surface. Here the coolant flows at a slower than required speed to adequately remove heat from the heat sink surface. This stagnation reduces the effectiveness of the heat transfer in the cooling system. Very often, the rate of cooling is less than the rate at which heat arrives at that interface surface, which causes an accumulation of heat at the surface. Several options have been proposed in the art to reduce this effect, including increasing the speed of the flow of the coolant or introducing structural features which cause turbulent flow and increased effective surface area.

Under certain circumstances, moisture from the ambient environment may condense on the heat sink or cold plate. In the case of liquid-cooled heat sinks, there are periods of time during which the temperature of the heat sink may fall below the temperature of the surrounding environment, often referred to in the art as "subambient" operation. This condition may occur any time the surface temperature of the heat sink falls below the ambient temperature. When this subambient operation condition occurs, moisture from the surrounding atmosphere may condense on the outer surface of the heat sink. The condensed moisture collects and runs off of the heat sink and into contact with the circuit board, semiconductors and packages, and other components. This free liquid can cause significant damage to those components and degrade the overall performance of the electronic device, or even destroy it all together.

There is a need for a liquid-cooled heat sink having a thermal jacket that can be positioned on or near a semiconductor package that will provide both optimum turbulent flow and increased surface area for effective heat transfer to the stream of liquid, and reduce or prevent condensation from forming in appreciable quantities on the surface of the device during subambient operation.

SUMMARY OF THE INVENTION

A liquid-cooled sink having a thermal jacket is provided including a housing with a peripheral side wall extending from the perimeter of a bottom wall and a lid sized to engage the peripheral side wall so as to form a chamber. A fluid inlet port and a fluid outlet port are defined through the lid, and disposed in fluid communication with the chamber. A plurality of pins project outwardly from the bottom wall so as to be positioned within the chamber and arranged in a staggered pattern. The pins include an end that engages the lid to provide structural support, and to prevent deflection of the lid by high liquid pressure. The liquid cooled heat sink of the present invention also includes a thermal jacket that reduces the rate of condensation of moisture during subambient operation of the liquid-cooled heat sink. The thermal jacket includes a bonding layer positioned in substantially surrounding and overlying relation to the liquid-cooled heat sink, at least one porous layer positioned in substantially surrounding and overlying relation to the bonding layer, a barrier layer positioned in substantially surrounding and overlying relation to the at least one porous layer; and a sealant layer positioned in substantially surrounding and overlying relation to the barrier layer. In this way, the at least one porous layer traps air close to the surface of the heat sink so as to provide a thermally insulating air barrier between the surface of the heat sink and the ambient environment.

In one alternative embodiment of the invention, a liquid-cooled heat sink is provided having a housing including a peripheral side wall extending from the perimeter of a bottom wall and a lid sized to engage the peripheral side wall so as to form a chamber. A fluid inlet port and a fluid outlet port are defined through the lid, and disposed in fluid communication with the chamber. A fin having a plurality of corrugations is positioned within the chamber so that at least one of the corrugations engages the bottom wall and at least one of the corrugations engages the under surface of the lid. A thermal jacket is formed on the outer surface of the heat liquid-cooled sink that includes a bonding layer positioned in substantially surrounding and overlying relation to the cooled heat sink, at least one porous layer positioned in substantially surrounding and overlying relation to the bonding layer, a barrier layer positioned in substantially surrounding and overlying relation to the at least one porous layer; and a sealant layer positioned in substantially surrounding and overlying relation to the barrier layer. Here again, the at least one porous layer traps air close to the surface of the heat sink so as to provide a thermally insulating air barrier between the surface of the heat sink and the ambient environment.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
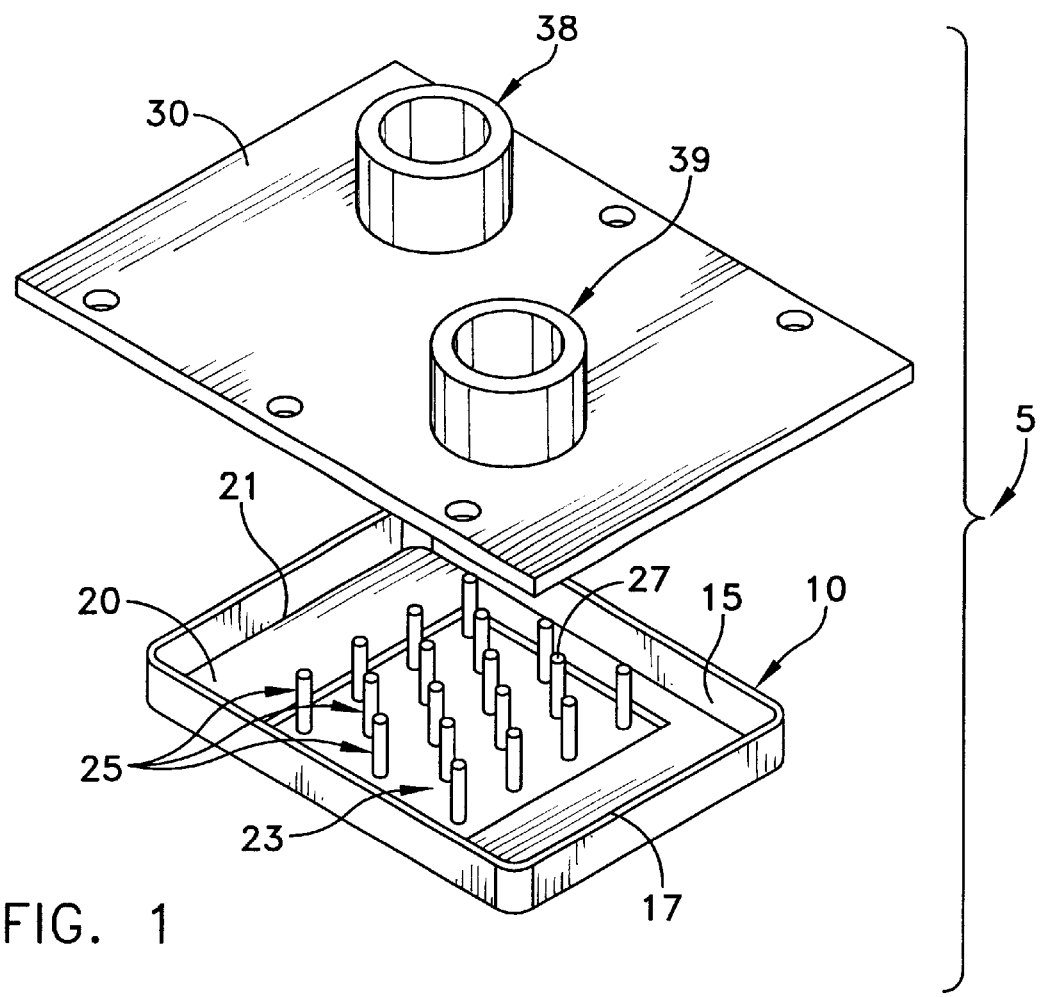
FIG. 1 is an exploded perspective view of a liquid cooled heat sink formed in accordance with one embodiment of the present inventions.
Figure 2:
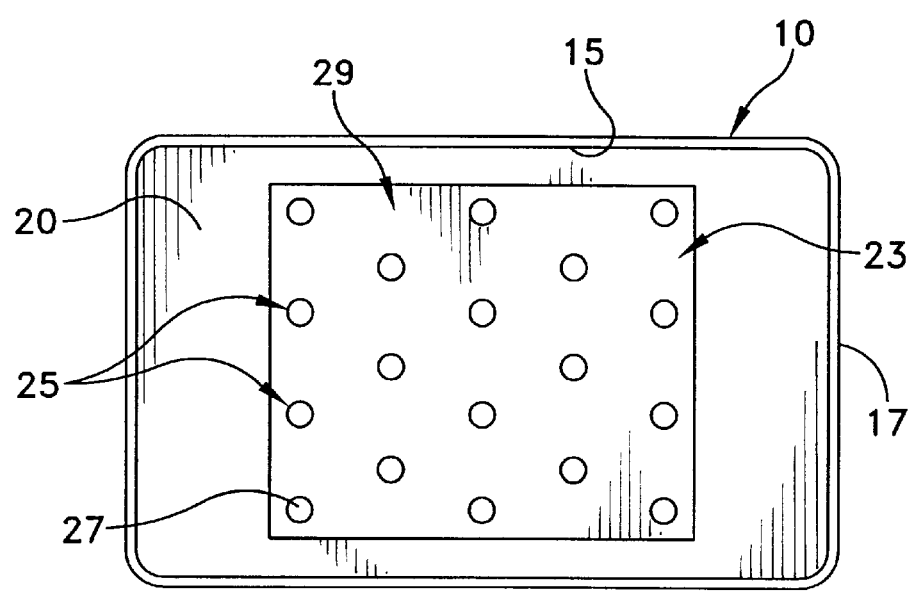
FIG. 2 is a top plan view of a housing having an array of pins, as shown in FIG. 1.
Figure 3:
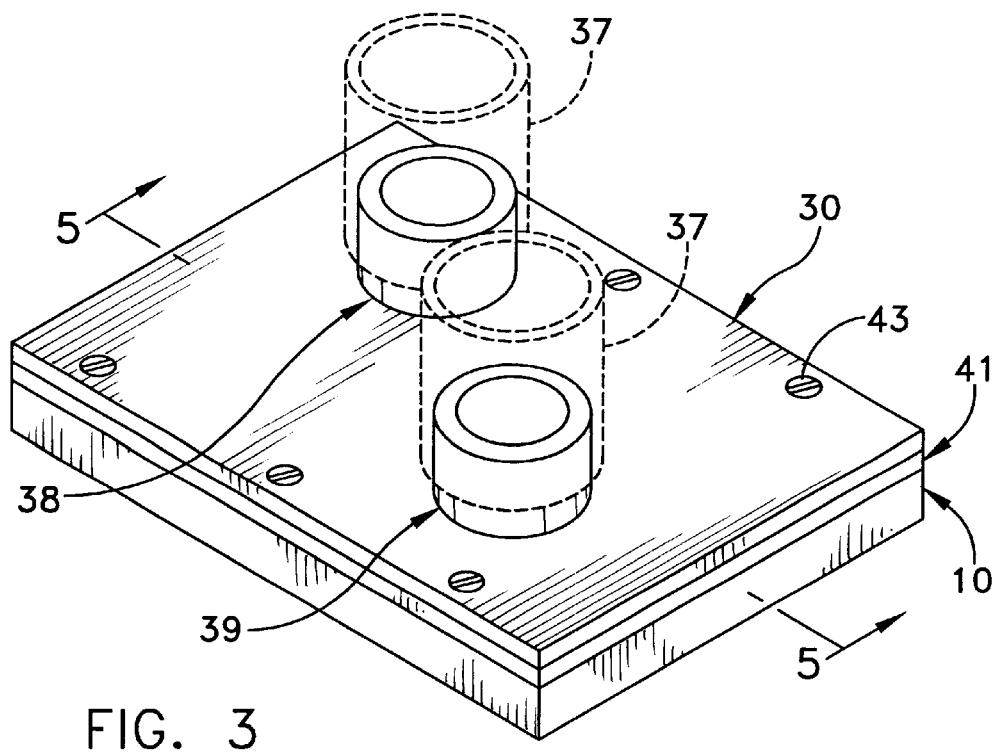
FIG. 3 is a prospective view of a fully assembled liquid cooled heat sink.
Figure 5:
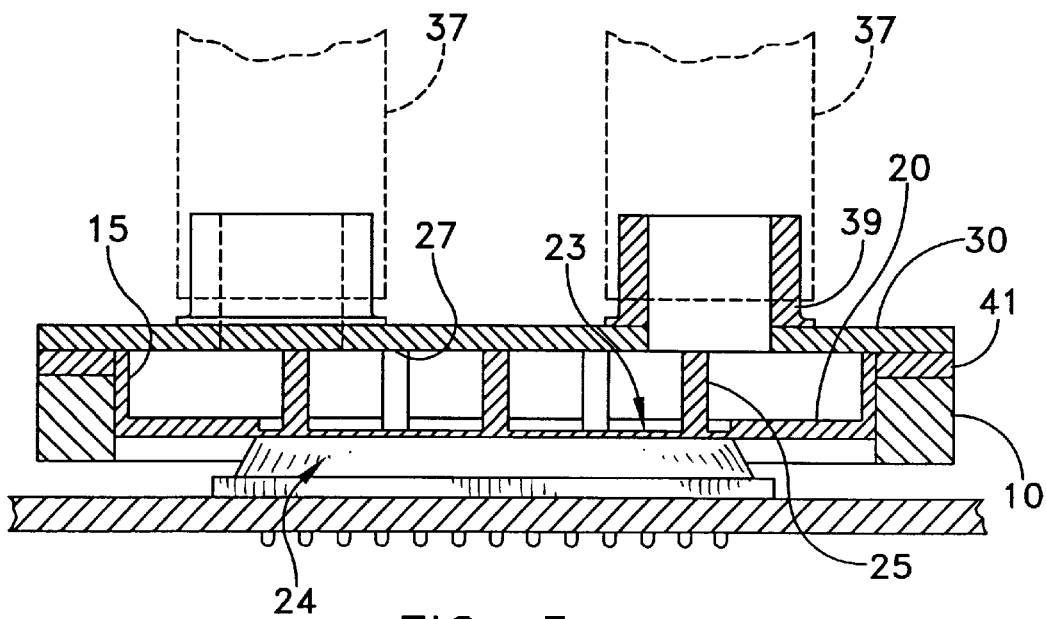
FIG. 5 is a cross-sectional view of the liquid cooled heat sink shown in FIG. 3, as taken along line 5—5.

This description of preferred embodiments is intended to be read in connection with the accompanying drawings, which are to be considered part of the entire written description of this invention. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship.

Referring to FIGS. 1–4, one embodiment of a liquid-cooled heat sink 5 formed in accordance with the present invention comprises a housing 10 including a peripheral side wall 15 that extends upwardly from the perimeter of a bottom wall 20, and includes a top edge surface 17 and an outer surface 19. More particularly, housing 10 is formed from a thermally conductive material, such as copper, steel, etc., and is typically milled as a single piece. Bottom wall 20 is often rectilinear in shape, with side wall 15 arranged in substantially perpendicular relation to a perimeter edge 21. A recessed portion 23 of bottom wall 20 is formed by thinning bottom wall 20 so as to reduce its thermal resistance in that location. The outer surface of recessed portion 23 of bottom wall 20 is adapted to interface with a semiconductor device directly, or to interface with the semiconductor device's packaging 24 so as to provide a conduit for thermal energy generated by the semiconductor device. Such an adaptation may include the introduction of a material having greater thermal conductivity properties than the material that forms the housing as a whole, e.g., silver, diamond, etc.

A plurality of pins 25 project outwardly in substantially perpendicular relation to the interior surface of recessed portion 23 of bottom wall 20. Each individual pin 25 is preferably cylindrically shaped, but may have any number of other cross-sectional shapes including, but not limited to circular, rectilinear, elliptical, generally polygonal, etc. At least a portion of plurality of pins 25 have a length that positions their free end 27 at or slightly above top edges surface 17 of side wall 15.

Significantly, plurality of pins 25 are arranged in a series of rows to form a non-rectangular, staggered pattern or grid of pins 29, i.e., a series of rows of pins 25 where the pins in adjacent rows are not placed one behind the other, but rather are shifted transversely relative to one another such that pins in adjacent rows are off-set with respect to one another. In this way, a portion of the coolant fluid flowing through the staggered grid of pins 29 engages each of pins 25 along their length, while another portion of the coolant fluid flowing through staggered grid of pins 29 passes through the gap formed between adjacent pins 25 so as to directly impinge upon a pin positioned in the next row and spaced from the gap. Unlike prior art pin arrays, however, coolant that does not initially engage a pin 25 in a first row will subsequently engage a pin 25 disposed in the next row of pins as a result of the staggered, off-set pattern. Staggered pattern of pins 29 significantly increases the level of turbulence in the flowing coolant liquid. No jets of liquid coolant are required to enhance turbulent flow. Advantageously, coolant entering housing 10 may impinge directly upon a pin end 27, a portion of a pin end 27, or directly and entirely onto the surface of recessed portion of 23 of bottom wall 20 without affecting the heat transfer characteristics of liquid-cooled heat sink 5. This greatly reduces the cost of manufacturing of heat sink 5, while at the same time increasing the heat transfer characteristics of the device.

Figure 4:
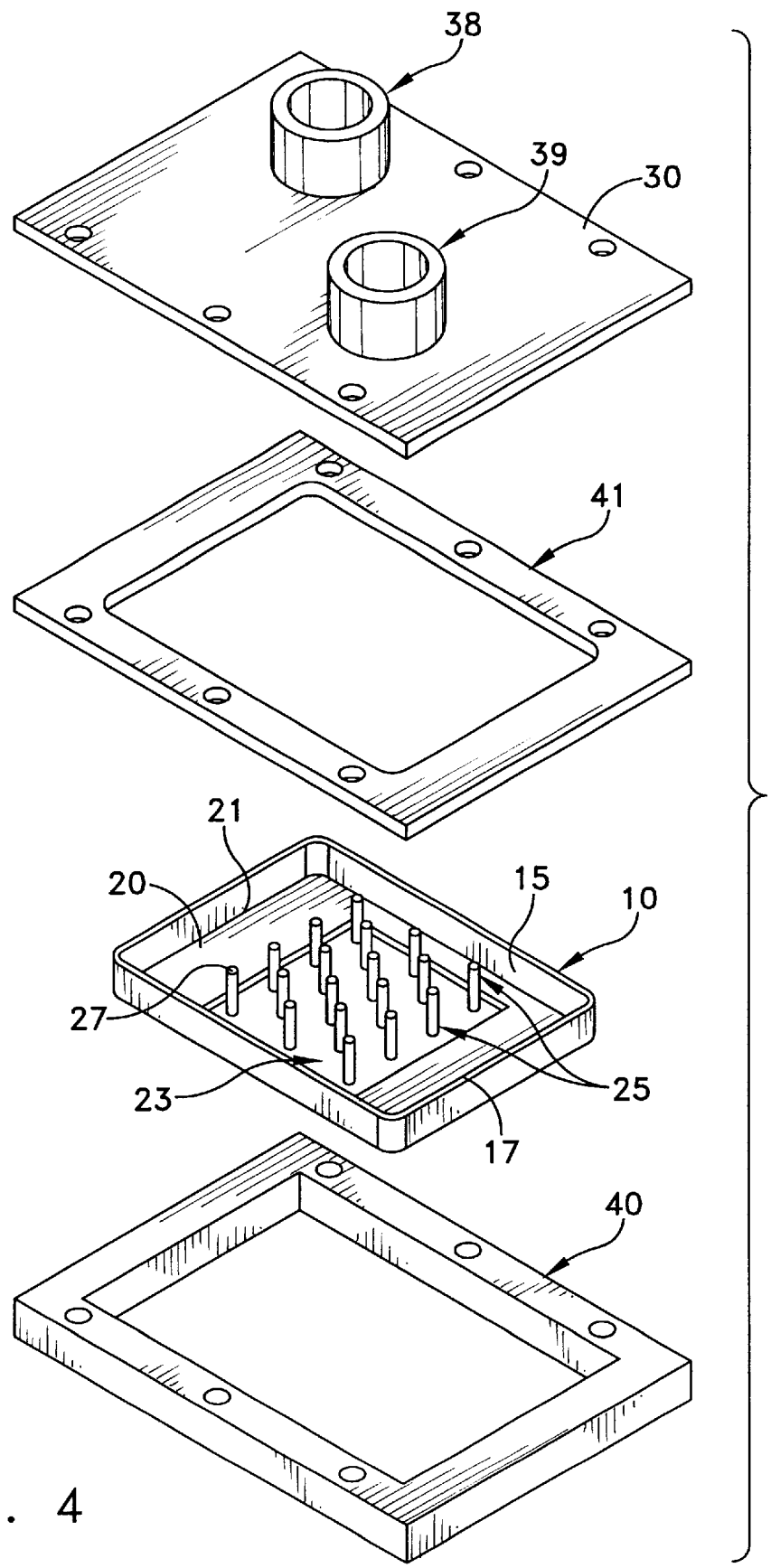
FIG. 4 is an exploded perspective view of the heat sink shown in FIG. 3.

A lid 30 is sized and shaped to engage top edge surface 17 of side wall 15 so as to enclose pin grid 29 in a chamber that is defined between side wall 15, bottom wall 20, and lid 30. Fluid inlet port 38 and outlet port 39 are arranged on lid 30 so as to be in fluid communication with pin grid 29 and a conventional conduit, e.g., hoses 37. A fluid inlet port 38 and a fluid outlet port 39 are defined through lid 30 so as to be in fluid communication with pin grid 29. Pin ends 27 of at least some of pins 25 engage the under surface of lid 30, and are preferably brazed or welded to lid 30. In this way, pins 25 also provide structural so as to prevent deflection of lid 30 when high pressure liquid is introduced into liquid-cooled heat sink 5. Referring to FIG. 4, liquid-cooled heat sink 5 may be assembled to the structure supporting the electric circuit by means of a frame 40. Lid 30 is fastened to frame 40 by conventional fasteners 43, by welding, or by any other conventional fastening means that will ensure a liquid tight seal. A thermally insulating gasket 41 is positioned between the under surface of lid 30 and frame 40 to prevent unwanted thermal interactions.

Figure 6:
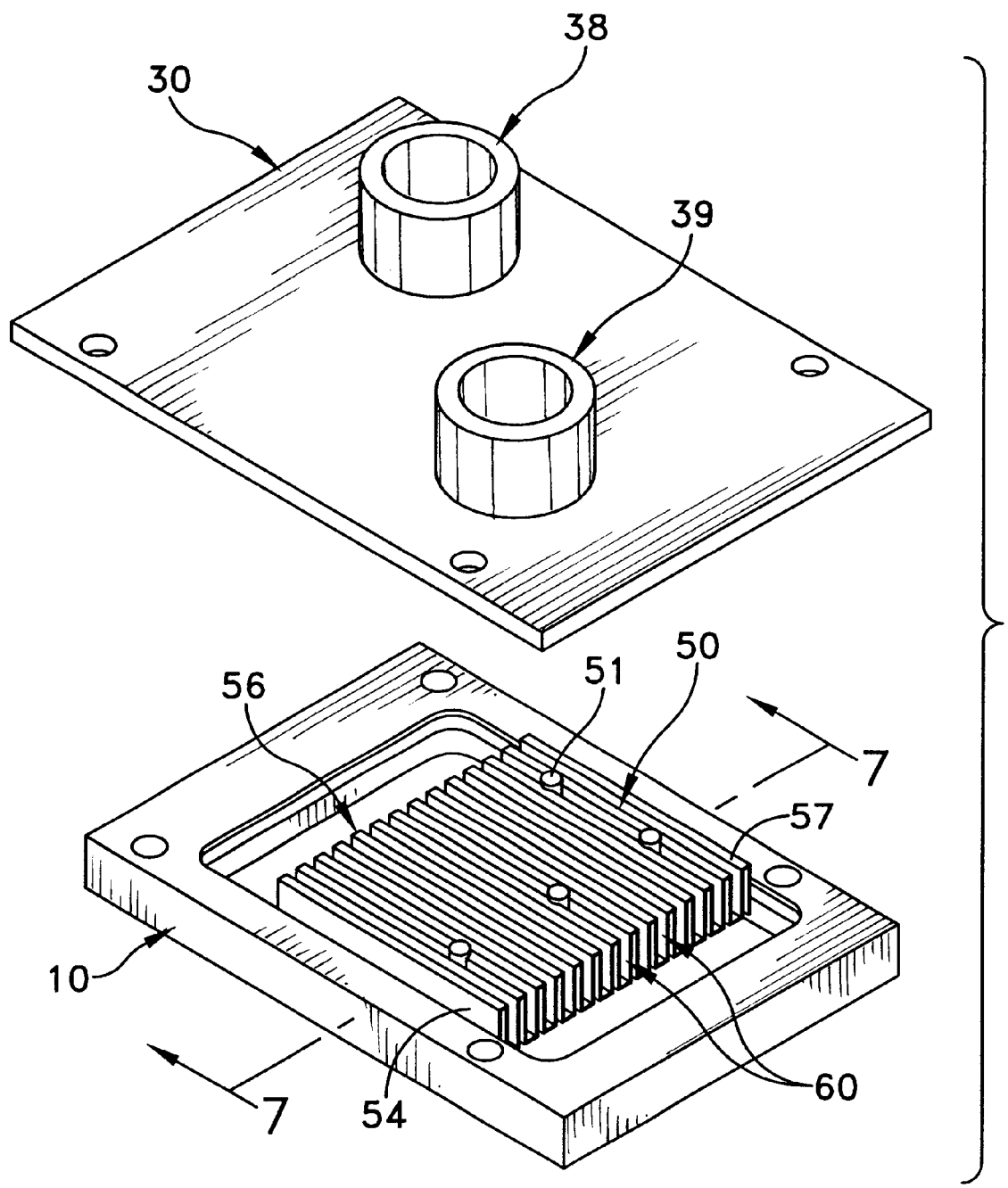
FIG. 6 is a perspective, exploded view of an alternative embodiment of the liquid cooled heat sink shown in FIG. 1.
Figure 7:
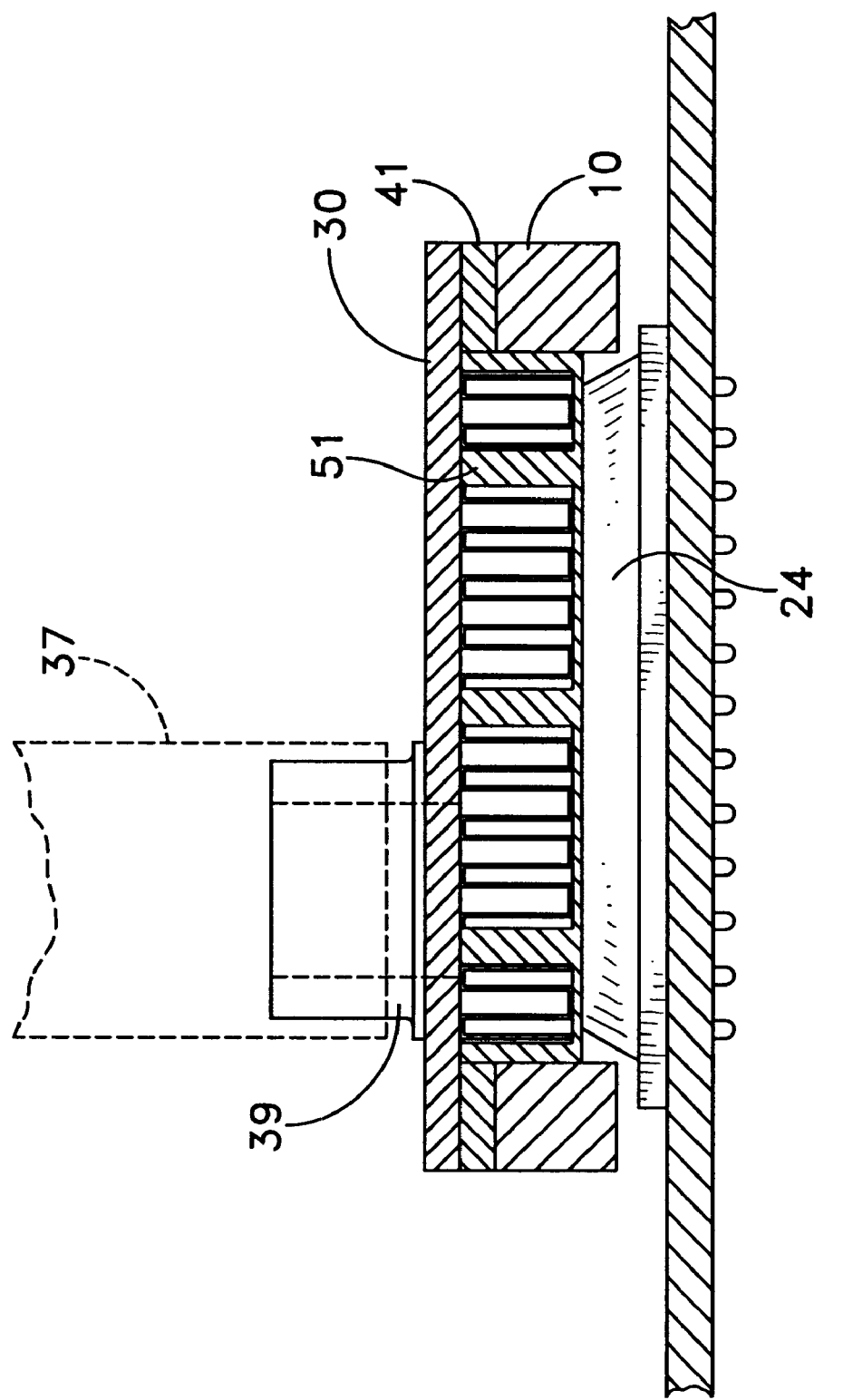
FIG. 7 is a cross-sectional view of the liquid cooled heat sink shown in FIG. 6, as taken along line 7—7.
Figure 8:
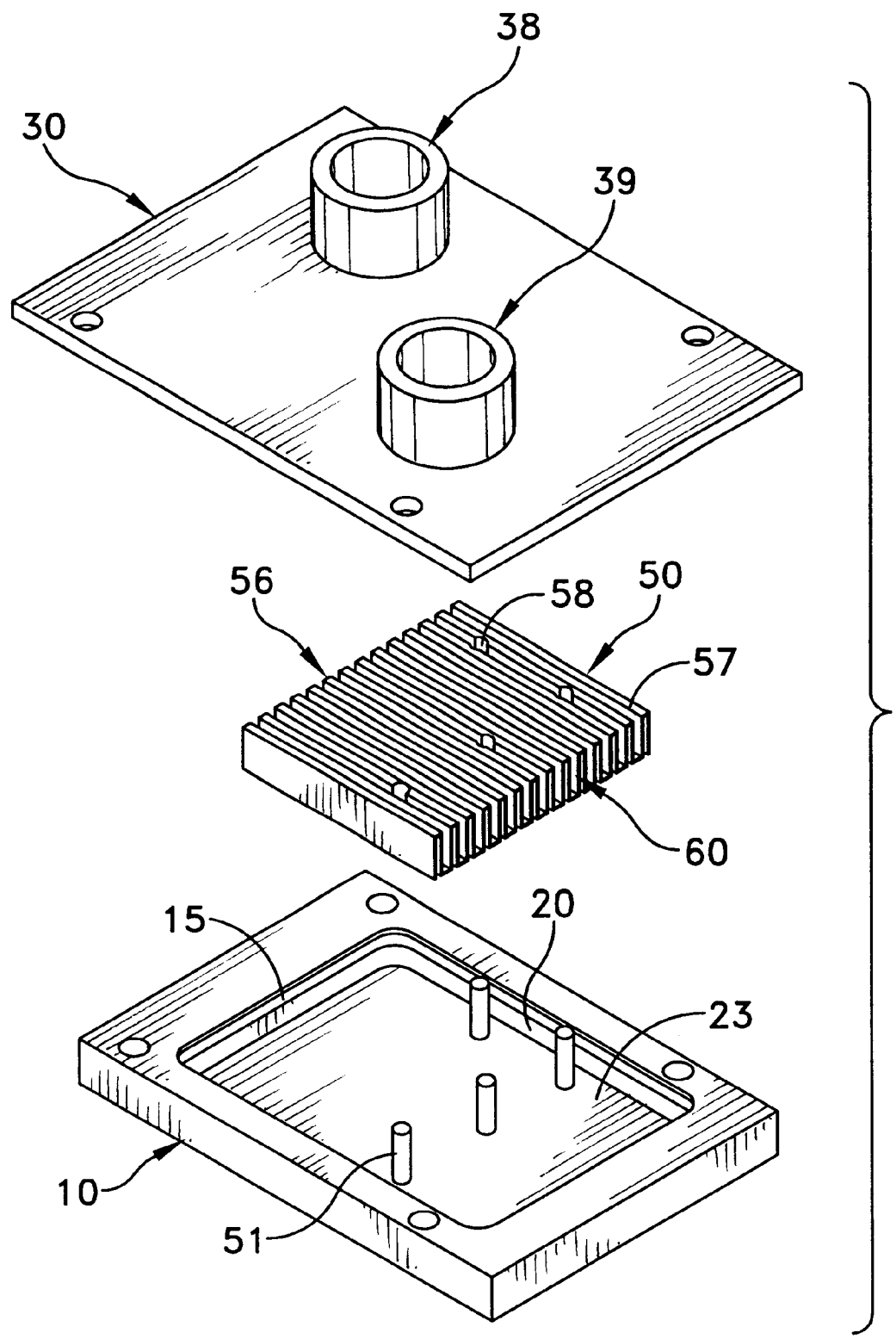
FIG. 8 is a prospective, exploded view of the liquid cooled heat sink shown in FIGS. 6 and 7.
Figure 9:
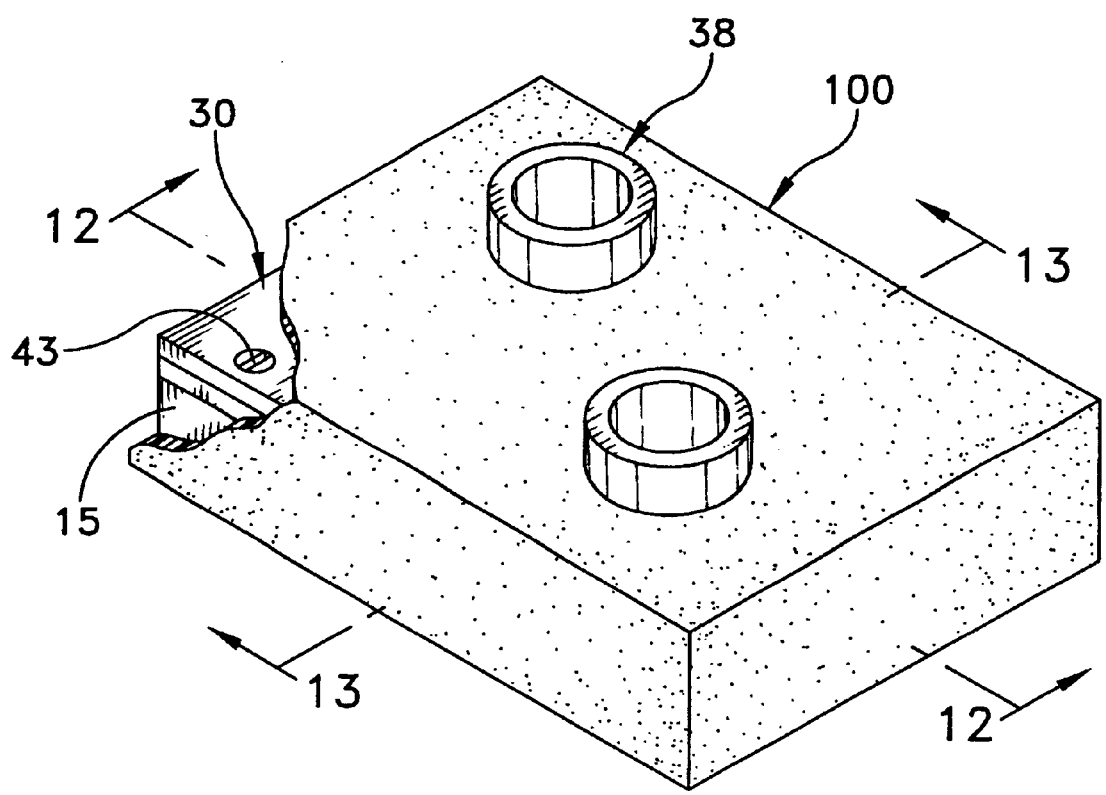
FIG. 9 is a perspective view of a liquid cooled heat sink having a thermal jacket formed on its outer surface in accordance with the present invention, with a portion of the thermal jacket broken away for clarity of illustration.

Referring to FIGS. 6–8, an alternative embodiment of the invention is provided in which a corrugated or folded fin 50 is fixed in position within housing 10 by a plurality of pins 51. More particularly, fin 50 is made up of a series of thin, flat fin walls 54, folded relative to one another about crests 56. Crests 56 are shaped so as to be substantially flat, rather than sharply pointed. This arrangement provides a surface that is less prone to damage, and is more suitable for brazing, soldering, or welding to recessed portion 23 of bottom 20 and to the undersurface of lid 30. Although crests 56 are not pointed and sharp, fin walls 54 may themselves have a divergent shape, rather than being parallel to one another.

In one embodiment, fin walls 54 are packed so closely as to be effectively parallel to one another, with a constant wall-to-wall separation equal to the flat top wall 57 formed by crest 56. A plurality of through holes 58 are defined through fin 50, and are arranged in a pattern to match the pattern of pins 51 that project outwardly from recessed portion 23 of bottom 20. In this way, fin 50 may be positioned within housing 10 in such a way that each pin 51 is received within a respective through-hole 58, thereby assuring proper alignment of fin 50 within housing 10 and providing structural support and reinforcement. It will be understood that only one pin 25 need be received within a through-hole to properly position fin 50 within housing. 10.

When fin 50 is brazed or welded to recessed portion 23 of bottom wall 20, and to the undersurface of lid 30, a series of adjacent flow passages 60 are formed by the inner surfaces of two adjacent fin walls 54. A liquid-cooled heat sink 5 having a corrugated fin 50 is operated in the same manner as when plurality of pins 25 are employed. Here however, the need for turbulent flow is reduced as a result of the substantially increased heat transfer properties created by the increased surface area provided by fin walls 54 within flow passages 60.

Figure 10:
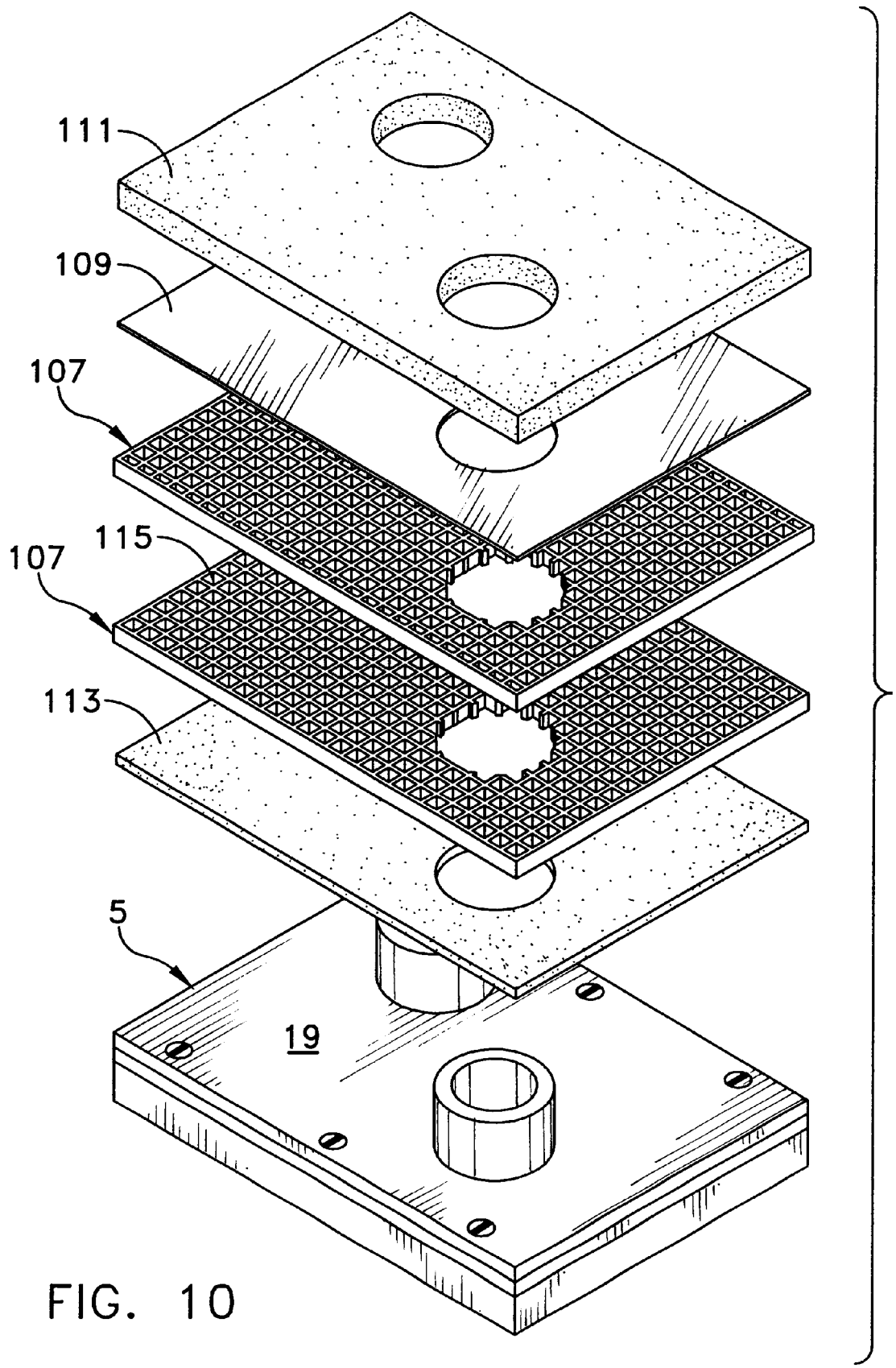
FIG. 10 is a perspective, exploded view of the liquid cooled heat sink shown in FIG. 9, with the various layers of the thermal jacket exploded away from the top surface of the heat sink for clarity and illustration.
Figure 11:
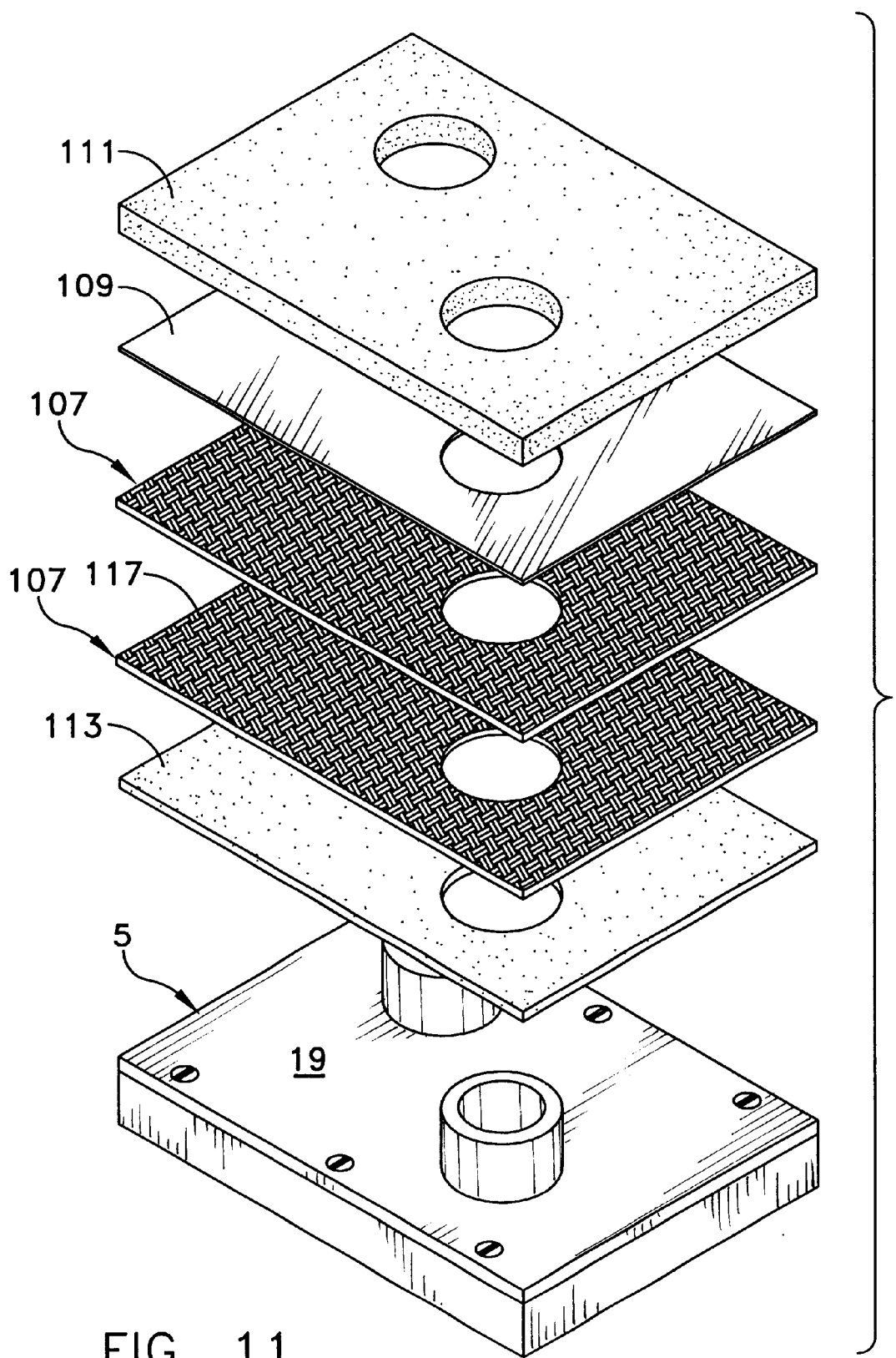
FIG. 11 is a perspective, exploded view similar to that shown in FIG. 10, but illustrating the use of woven material in some layers.

Referring now to FIGS. 9–13, a thermal jacket 100 may be positioned over those surfaces of liquid-cooled heat sink 5 that do not directly engage semiconductor package 24, in order to reduce or eliminate condensation that may form during subambient operation. Referring to FIGS. 10 and 11, thermal jacket 100 comprises at least one porous layer 107, a barrier layer 109, a sealant layer 111, and a bonding layer 113. More particularly, porous layer 107 comprises one or more sheets of a mesh or screen, such as an porous membrane having a lattice structure formed by a plurality of openings (identified by reference numeral 115 in FIG. 10), or a fabric-like material of the type having a warp and weft associated with the fibers making up the structure of the fabric (identified by reference numeral 117 in FIG. 11). Porous layer 107 may be formed from a polymer, cloth, or other low thermal conductivity material, and should be sufficiently compliant prior to application to liquid-cooled heat sink 5 so that it can be shaped to conform to surface features. Typically, individual sheets of porous layer 107 will have a thickness in the range from about 0.05 to about 6 millimeters (mm), and preferably in the range from about 0.5 mm to 3 mm. Multiple sheets of porous layer 107 may be used in connection with the present invention, with one sheet being applied directly over top of a prior sheet, and need not be fastened together. For example, the polypropylene mesh manufactured by the SEFAR America, Inc., under the trade name woven thermoplastic mesh has been used in connection with a multiple layer embodiment of the invention with good results. Advantageously, porous layer 107 traps air close to the surface of heat sink 5, via the openings in the lattice structure or the spaces formed by the warp and weft, so as to provide a thermally insulating air barrier between the surface of heat sink 5 and the ambient environment.

Porous layer 107 is attached to the surface of liquid-cooled heat sink 5 by bonding layer 113. Bonding layer 113 comprises a thermally stable adhesive which may be applied in the form of a conventional "double-sided" tape adhered directly to the outer surface of liquid-cooled heat sink 5 prior to the application of porous layer 107. For example, the double-sided tape manufactured by the 3M company, under the trade name 966 Hitemperature acrylic has been used with good results. Of course, other thermally stable adhesives may be used to maintain porous layer 107 in place on the surface of liquid-cooled heat sink 5.

A barrier layer 109 is applied to the outer surface of the last sheet of porous layer 107, followed by a sealant layer 111 to complete thermal jacket 100. Barrier layer 109 comprises a relatively thin sheet of low thermal conductivity material such as a relatively thin polymer or cellulose film or the like. For example, a conventional polyethylene film or sheet has been used with good results. Sealant layer 111 is a low thermal constant (i.e., low "k") epoxy of the type well known in the art. For example, the low thermal constant epoxy manufactured by the W.R. Grace & Co., under the trade name Stycast 2850 ST, with 24LV as a catalyst, has been used with good results. As a result of this construction, the openings in the lattice structure 115 or the spaces formed by the warp and weft 117 of porous layer 107 are prevented from being clogged or blocked by sealant layer 111 as a result of barrier layer 109.

Figure 12:
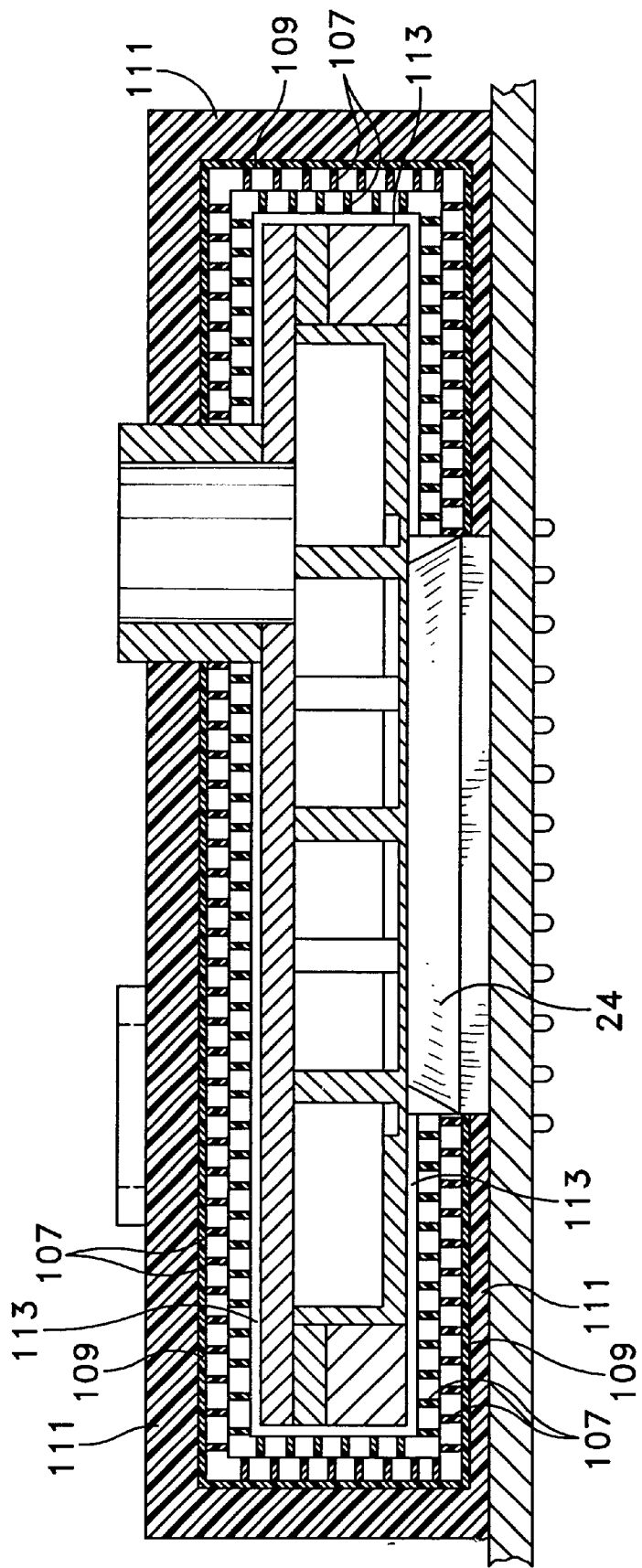
FIG. 12 is a cross-sectional view as taken along line 12—12 in FIG. 9.
Figure 13:
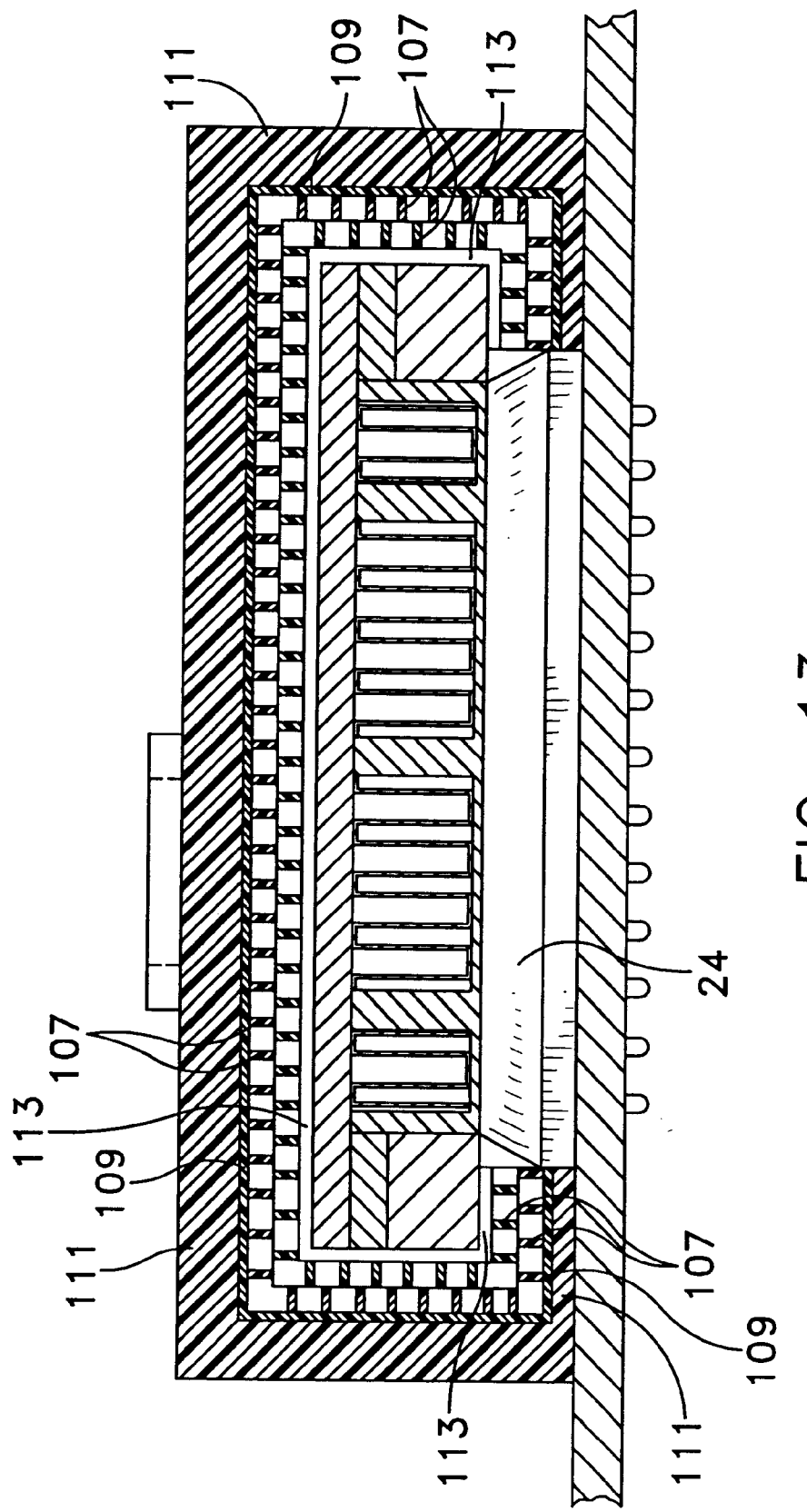
FIG. 13 is a cross-sectional view similar to that of FIG. 12, but taken along line 13—13 in FIG. 9, showing an alternative form of liquid cooled heat sink used in connection with a thermal jacket according to the present invention.

Referring to FIGS. 11–13, thermal jacket 100 may be formed on liquid-cooled heat sink 5 in the following manner. The portions of the outer surface 19 of liquid-cooled heat sink 5 that do not act as the direct thermal conduction pathway between the electronics devices or semiconductor package 24 and liquid-cooled heat sink 5 are first covered with bonding layer 113. Once covered with bonding layer 113, at least one sheet of porous layer 107 is applied to bonding layer 113. If multiple sheets of porous layer 107 are used, they may be "tacked" together (i.e., glued or bonded in some manner) at discrete positions and at various locations to hold them in place, since bonding layer 113 may not fully adhere to all sheets of a multiple sheet porous layer 107. Also, each sheet of porous layer 107 may be oriented such that there is a mismatch between the openings of the sheets, from layer to layer, that is formed by the lattice structure 115 or the spaces formed by the warp and weft 117. In this way, trapped air in porous layer 107 acts as an effective insulating barrier. This arrangement enhances the thermal insulating properties of thermal jacket 100. Once porous layer 107 is complete, barrier layer 109 is applied to the outer surface of the mesh followed by an application of sealant 111 to close and complete thermal jacket 100.

Advantageously, sealant 111 may be molded to conform to the outer profile of liquid-cooled heat sink 5.

In this way, when liquid-cooled heat sink 5 is at subambient temperatures, thermal jacket 100 forms an insulating barrier between surface 19 and the ambient environment. Thus, the outer surface of thermal jacket 100, i.e., the exposed surface of sealant layer 111, remains at or near to the ambient temperature surrounding the device. As a result, very little, if any, moisture is able to condense on the surface of thermal jacket 100.

It is to be understood that the present invention is by no means limited only to the particular constructions herein disclosed and shown in the drawings, but also comprises any modifications or equivalents within the scope of the claims.

What is claimed is:

1. A liquid-cooled heat sink with thermal jacket comprising:
   a housing including a side wall extending from the perimeter of a bottom wall and a lid sized to engage said peripheral side wall so as to form a chamber within said housing;
   a fluid inlet port and a fluid outlet port defined through said lid so as to be in fluid communication with said chamber; and
   a plurality of pins projecting outwardly from said bottom wall so as to be positioned within said chamber and arranged in a staggered pattern, said pins including an end that is secured to a surface of said lid; and
   a bonding layer applied to an outer surface of said liquid-cooled heat sink;
   at least one porous layer positioned in substantially surrounding and overlying relation to said bonding layer;
   a barrier layer positioned in substantially surrounding and overlying relation to said at least one porous layer; and
   a sealant layer positioned in substantially surrounding and overlying relation to said barrier layer.

2. A liquid-cooled heat sink with thermal jacket according to claim 1 wherein said bottom wall of said housing includes a recessed portion formed by a thinned region of said bottom wall and said porous layer comprises at least one sheet of a porous membrane.

3. A liquid-cooled heat sink with thermal jacket according to claim 1 wherein said plurality of pins project outwardly in substantially perpendicular relation to said bottom wall and said porous membrane comprises a mesh screen having a lattice structure including a plurality of openings.

4. A liquid-cooled heat sink with thermal jacket according to claim 3 wherein said plurality of pins are in substantially perpendicular relation to a recessed portion of said bottom wall.

5. A liquid-cooled heat sink with thermal jacket according to claim 4 wherein at least a portion of said plurality of pins have a length that positions said end in engaging relation to said lid.

6. A liquid-cooled heat sink with thermal jacket according to claim 1 wherein said porous layer comprises at least one sheet of an porous membrane.

7. A liquid-cooled heat sink with thermal jacket according to claim 1 wherein said plurality of pins are arranged in a series of rows to form a non-rectangular, staggered pattern of pins such that pins in adjacent rows are off-set with respect to one another.

8. A liquid-cooled heat sink with thermal jacket according to claim 2 wherein said porous layer comprises a mesh screen having a lattice structure including a plurality of openings.

9. A liquid-cooled heat sink with thermal jacket according to claim 1 wherein a portion of a coolant fluid flowing through said chamber and engaging said pins engages each of said pins along their length, while another portion of said coolant fluid flowing through said pins passes between a gap formed between adjacent pins in a first row so as to directly impinge upon a pin positioned in a second row and spaced from said gap.

10. A liquid-cooled heat sink with thermal jacket according to claim 2 wherein said porous layer comprises a fabric screen having a warp and weft.

11. A liquid-cooled heat sink with thermal jacket according to claim 1 wherein said porous layer comprises a mesh screen that is sufficiently compliant so as to be conformally shaped to said cooled heat sink.

12. A liquid-cooled heat sink with thermal jacket according to claim. 1 wherein said porous layer includes multiple sheets of a mesh screen with one sheet being applied directly over top of a prior sheet.

13. A liquid-cooled heat sink with thermal jacket according to claim 1 wherein said porous layer comprises a mesh screen formed from a polymer having relatively low thermal conductivity.

14. A liquid-cooled heat sink with thermal jacket comprising:
   a housing including a side wall extending from the perimeter of a bottom wall and a lid sized to engage said peripheral side wall so as to form a chamber within said housing;
   a fluid inlet port and a fluid outlet port defined through said lid so as to be in fluid communication with said chamber; and
   a plurality of pins projecting outwardly from said bottom wall so as to be positioned within said chamber and arranged in a staggered pattern, said pins including an end that is secured to a surface of said lid; and
   a bonding layer applied to an outer surface of said liquid-cooled heat sink;
   a porous layer including multiple sheets of a mesh screen with each successive sheet being applied directly over top of a prior sheet, said multiple sheets being oriented such that there is a mismatch between said openings of said sheets from layer to layer, said porous layer positioned in substantially surrounding and overlying relation to said bonding layer;
   a barrier layer positioned in substantially surrounding and overlying relation to said at least one porous layer; and
   a sealant layer positioned in substantially surrounding and overlying relation to said barrier layer.

* * * * *